(12) United States Patent
Kim et al.

(10) Patent No.: US 7,744,719 B2
(45) Date of Patent: Jun. 29, 2010

(54) MANUFACTURING METHOD FOR DISPLAY DEVICE, MANUFACTURING APPARATUS FOR THE SAME AND DISPLAY DEVICE MADE BY THE SAME

(75) Inventors: Hoon Kim, Hwaseong-si (KR); Won-Hoe Koo, Suwon-si (KR); Jung-mi Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 182 days.

(21) Appl. No.: 11/756,861

(22) Filed: Jun. 1, 2007

(65) Prior Publication Data

US 2007/0298169 A1 Dec. 27, 2007

(30) Foreign Application Priority Data

Jun. 23, 2006 (KR) .................... 10-2006-0056876

(51) Int. Cl.
| B29C 65/00 | (2006.01) |
| B29C 65/48 | (2006.01) |
| B32B 17/00 | (2006.01) |
| B32B 37/00 | (2006.01) |
| C03C 27/00 | (2006.01) |
| H01J 1/62 | (2006.01) |
| H01J 63/04 | (2006.01) |

(52) U.S. Cl. .............. 156/295; 156/104; 156/286; 313/504

(58) Field of Classification Search ........... 156/99, 156/100, 102, 104, 106, 107, 285, 286, 295; 313/504, 512

See application file for complete search history.

(56) References Cited

U.S. PATENT DOCUMENTS

| 5,686,169 | A | * | 11/1997 | Hassall et al. ........... 428/195.1 |
| 6,111,355 | A | * | 8/2000 | Inoue et al. ................ 313/506 |
| 6,358,587 | B1 | * | 3/2002 | Saint et al. ................ 428/40.1 |
| 2002/0000296 | A1 | * | 1/2002 | Terada et al. ............... 156/295 |
| 2002/0193035 | A1 | * | 12/2002 | Wei et al. ..................... 445/22 |
| 2003/0218422 | A1 | * | 11/2003 | Park et al. .................... 313/512 |
| 2003/0226633 | A1 | * | 12/2003 | Muramoto et al. ......... 156/145 |
| 2004/0016506 | A1 | * | 1/2004 | Sakayori et al. ............ 156/291 |
| 2005/0036090 | A1 | * | 2/2005 | Hayashi et al. ............. 349/122 |
| 2005/0126700 | A1 | * | 6/2005 | Makimoto et al. ......... 156/285 |
| 2005/0155704 | A1 | * | 7/2005 | Yokajty et al. ............. 156/295 |
| 2006/0135029 | A1 | * | 6/2006 | Harada ....................... 445/25 |

FOREIGN PATENT DOCUMENTS

| JP | 08-220658 | 8/1996 |
| JP | 2003-303680 | 10/2003 |
| JP | 2006-049308 | 2/2006 |
| KR | 10-2003-0076623 | 9/2003 |
| KR | 10-2005-0077919 | 8/2005 |

* cited by examiner

Primary Examiner—Richard Crispino
Assistant Examiner—Brian R Slawski
(74) Attorney, Agent, or Firm—H.C. Park & Associates, PLC

(57) ABSTRACT

A manufacturing method for manufacturing a display device includes forming a discontinuous organic layer on at least one of a cover substrate and an insulating substrate provided with a display device element, arranging the insulating substrate and the cover substrate with facing each other for the organic layer to be interposed therebetween, and assembling the cover substrate and the insulating substrate by pressing the substrates together.

13 Claims, 19 Drawing Sheets

US 7,744,719 B2

MANUFACTURING METHOD FOR DISPLAY DEVICE, MANUFACTURING APPARATUS FOR THE SAME AND DISPLAY DEVICE MADE BY THE SAME

CROSS-REFERENCE TO RELATED APPLICATIONS

This application claims priority from and the benefit of Korean Patent Application No. 10-2006-0056876, filed on Jun. 23, 2006, which is hereby incorporated by reference for all purposes as if fully set forth herein.

BACKGROUND OF THE INVENTION

1. Field of the Invention

The present invention relates to a manufacturing method for display device, a manufacturing apparatus for the same, and a display device made by the same, particularly, to a manufacturing method that may minimize permeation of oxygen and moisture from a side surface of a display device, a manufacturing apparatus used for the display device, and a display device manufactured by the same.

2. Discussion of the Background

Recently, the organic light emitting diode (OLED) device has attracted attention and interest in the industry of flat panel display devices because of its low driving voltage, slim shape, light weight, and high-speed response.

An OLED device typically includes a thin film transistor including a gate electrode, a source electrode, and a drain electrode; a pixel electrode connected with the thin film transistor; a wall dividing the pixel electrodes; a light emitting layer formed on the pixel electrodes disposed on regions between the walls; and a common electrode formed on the light emitting layer.

The light emitting layer is formed of an organic material and is capable of emitting light. Moisture and oxygen may deteriorate the light emitting layer and decrease its quality and life time. In order to prevent the light emitting layer from deteriorating, the light emitting layer may be encapsulated with a cover substrate. Further, an organic material such as a sealant interposed between the insulating substrate and the cover substrate blocks the permeation of oxygen and moisture.

However, organic materials such as the sealant have a relatively high permeation rate of oxygen and moisture. Thus, the quality and life time of the display device may be decreased if there is a large gap to be sealed between the two substrates.

SUMMARY OF THE INVENTION

The invention provides a manufacturing method of a display device that may minimize the permeation of oxygen and moisture.

The present invention also provides a manufacturing apparatus for manufacturing a display device that may minimize the permeation of oxygen and moisture.

The present invention also provides a display device that may minimize the permeation of oxygen and moisture.

The present invention discloses a manufacturing method for manufacturing a display device including forming a discontinuous organic layer on at least one of a cover substrate and an insulating substrate, with the insulating substrate including a display device element, arranging the insulating substrate and the cover substrate to face each other with the discontinuous organic layer interposed therebetween, and pressing the cover substrate and the insulating substrate together.

The present invention also discloses a manufacturing apparatus for manufacturing a display device including a table to mount a substrate, a mask disposed on the table, a squeeze to scan from one side of the mask to the other side of the mask to form a thin layer on the substrate, and a squeeze driving unit to drive the squeeze. The mask includes a plurality of mesh parts separately arranged on the mask, and a blocking part surrounding the mesh parts.

The present invention also discloses a display device including an insulating substrate provided with a display device element; a cover substrate facing the insulating substrate, and an organic layer interposed between the insulating substrate and the cover substrate, the organic layer at a periphery of the insulating substrate having a thickness different from a thickness at a central portion of the insulating substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
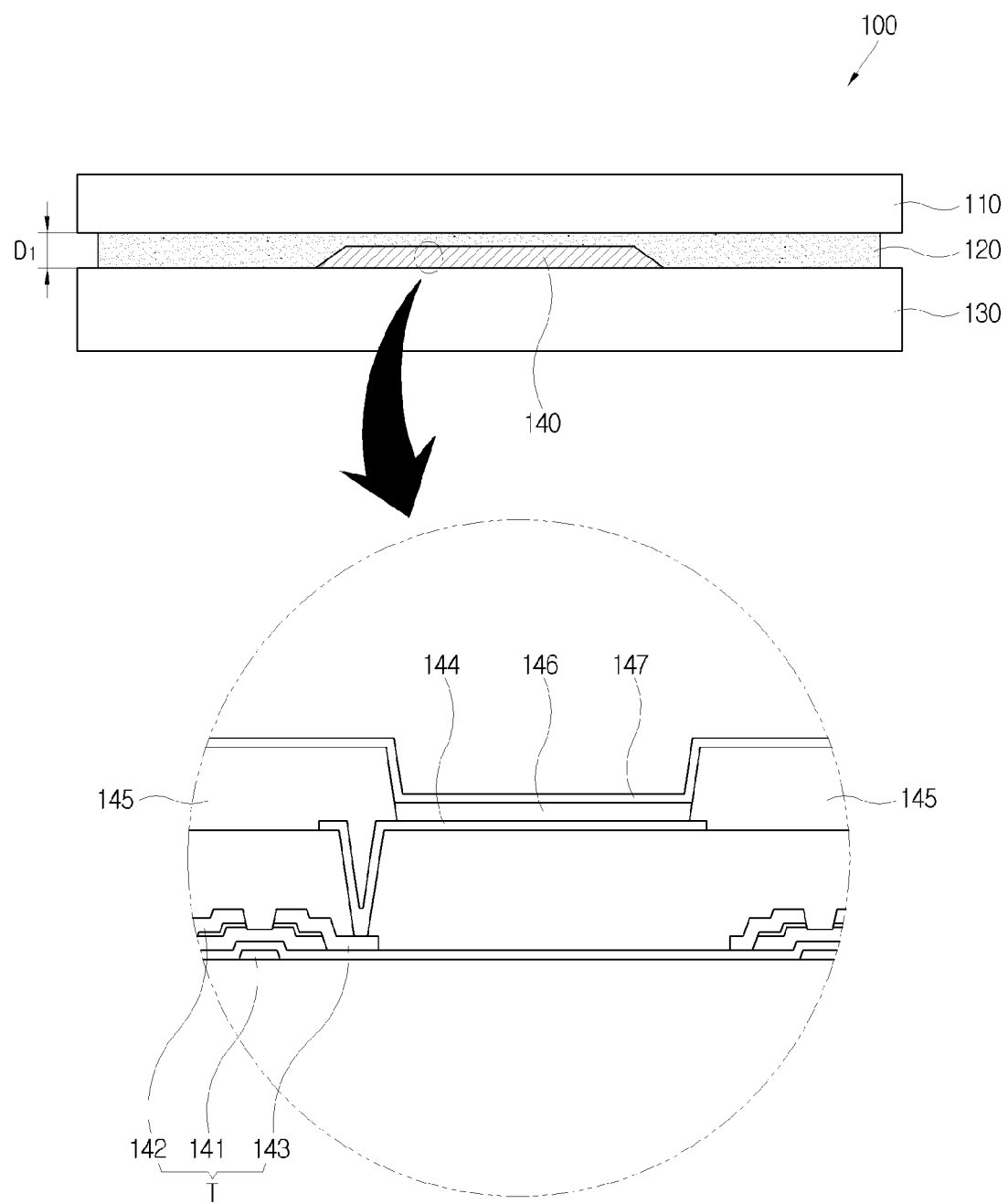
FIG. 1 is a cross sectional view of a display device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Though the case of forming an organic layer 120 on a cover substrate 110 is explained below for an example, the present invention is not limited to such a case but can be applied also for cases like forming an organic layer 120 on an insulating substrate 130 and forming an organic layer 120 on both substrates 130 and 110.

FIG. 1 is a cross sectional view of a display device according to a first exemplary embodiment of the present invention.

Generally, an OLED 100 may include a self light-emitting device made of an organic material emitting a light by an applied electric signal. The function and life time of such an organic material is vulnerable to moisture and oxygen. Thus, a sealing method should be able to protect the organic material (organic light emitting layer) from oxygen and moisture.

The OLED 100 according to the first exemplary embodiment of the present invention includes the insulating substrate 130 provided with a display device element 140, the cover substrate 110 facing the insulating substrate 130, and the organic layer 120 interposed between the insulating substrate 130 and the cover substrate 110.

The insulating substrate 130 is a transparent substrate and may include a glass substrate and a plastic substrate. Though not illustrated, a blocking layer may be formed on an upper surface of the insulating substrate 130, namely, between the display device element 140 and the insulating substrate 130. The blocking layer blocks oxygen and moisture that can permeate the display device element 140 through the insulating substrate 130 and may be formed of materials including SiON, $SiO_2$, $SiN_x$, and $Al_2O_3$. The blocking layer may be formed by methods like sputtering etc.

The display device element 140 includes a thin film transistor T including gate electrode 141, a source electrode 142, and a drain electrode 143, a pixel electrode 144 connected to the thin film transistor T, a wall 145 dividing each pixel electrode 144, an organic light emitting layer 146 formed on the pixel electrode 144 on a region between the walls 145, and a common electrode 147 formed on the organic light emitting layer 146. The display device element 140 displays an image corresponding to an input image signal from an information processing device.

The cover substrate 110 may be made of a material identical to the material of the insulating substrate 130. A soda-lime silicate glass substrate, a boro-silicate glass substrate, a silicate glass substrate, and a lead glass substrate may be used for the cover substrate 110. The width of the cover substrate 110 may be between 0.1 mm and 10 mm and more preferably between 1 mm and 10 mm to prevent the permeation of moisture and oxygen to the display device element 140 through the cover substrate 110.

The organic layer 120 is interposed between two substrates 110 and 130. The organic layer 120 covers the display device element 140 and is responsible for protecting the organic light emitting layer 146 from moisture and oxygen and coupling the insulating substrate 130 to the cover substrate 110. The organic layer 120 may be formed of a sealant including acryl resin and epoxy resin.

The OLED 100 manufactured by a method according to the first exemplary embodiment of the present invention has a short distance D1 between the two substrates 110 and 130. More specifically, the distance D1 between the two substrates 110 and 130 may be in a range of 1 μm to 20 μm.

FIG. 2A, FIG. 2B, FIG. 2C, FIG. 2D, and FIG. 2E explain the method of manufacturing the display device according to the first exemplary embodiment of the present invention.

Figure 2A:
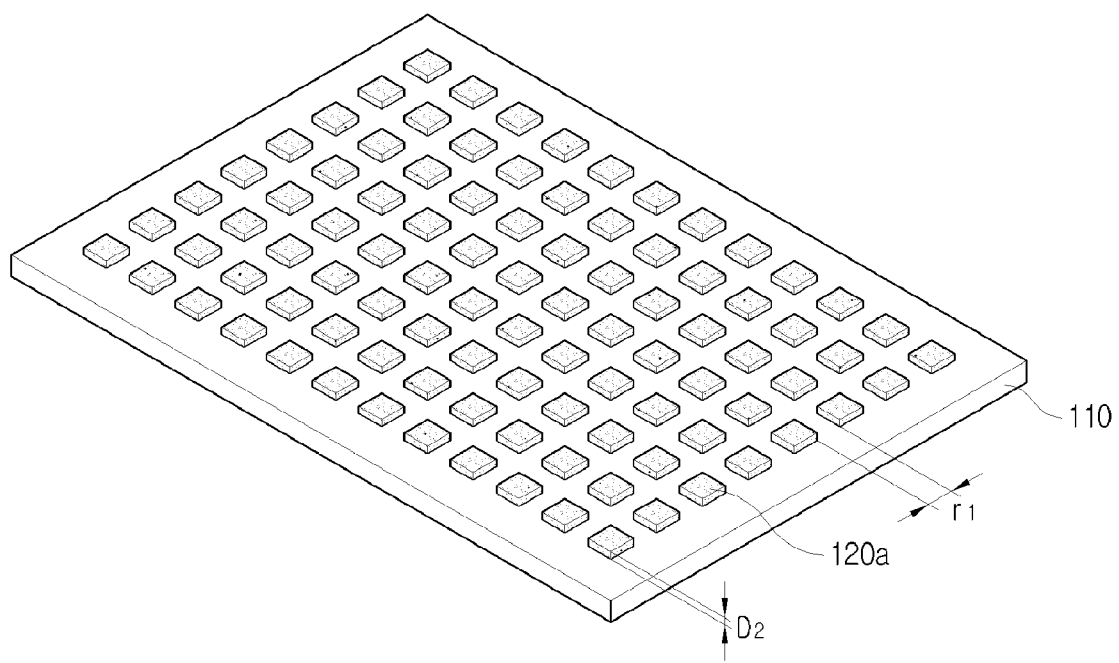
FIG. 2A, FIG. 2B, FIG. 2C, FIG. 2D, and FIG. 2E are figures explaining manufacturing methods for the display device according to the first exemplary embodiment of the present invention.

The method of manufacturing the OLED 100 (refer to FIG. 1) according to the first exemplary embodiment of the present invention, as illustrated in FIG. 2A, uniformly forms a discontinuous organic layer including a plurality of organic layers 120a on the front surface of the cover substrate 110 spaced apart at equal intervals. Here, the organic layers 120a are responsible for protecting the light emitting layer 146 (refer to FIG. 1) from moisture and oxygen and for coupling the insulating substrate 130 to the cover substrate 110. The organic layers 120a may be formed of a sealant including acryl resin and epoxy resin.

The methods for uniformly forming the plurality of organic layers 120a on the front surface of the cover substrate 110 may include screen printing, roll printing, slit coating, etc. Screen printing is a method using a mask formed with a pattern corresponding to a pattern of the organic layers 120a to be formed; roll printing is a method using a roll formed with a groove filled with the organic material to be transferred to the cover substrate 110 by rolling the roller; and slit coating is a method using a slit coater to form the organic layers 120a on the cover substrate 110.

The organic layers 120a according to the first exemplary embodiment of the present invention are substantially identical in size. The thickness D2 of the organic layers 120a is between 3 μm and 20 μm, and the area thereof is equal to or larger than 1 μm². Forming the organic layers 120a with a thickness D2 equal to or less than 3 μm may be difficult, and the organic layers 120a of such thickness are too thin to be effective adhesives. If the thickness D2 of the organic layers 120a is equal to or larger than 20 μm, the cover substrate 110 and the insulating substrate 130 are too far apart, and the amount of oxygen and moisture permeating the two substrates 110 and 130 increases. Though the area of the organic layers 120a may be large or small depending on the size of the cover substrate 110, it may be difficult to form their area smaller than 1 μm². An interval r1 between the organic layers 120a is proportional to the area of organic layers 120a and the pressure applied when assembling the two substrates 110 and 130. Specifically, as the area of the organic layers 120a and the pressure increase, spreading of the organic layers 120a in a direction parallel to the substrates 110 and 130 increases, so that the interval r1 between the organic layers 120 may be set larger. The thickness D2, the area, and the interval r1 of the organic layers 120a should be determined so there is no open space in the organic layer 120 once the two substrates 110 and 130 are assembled.

Figure 2B:
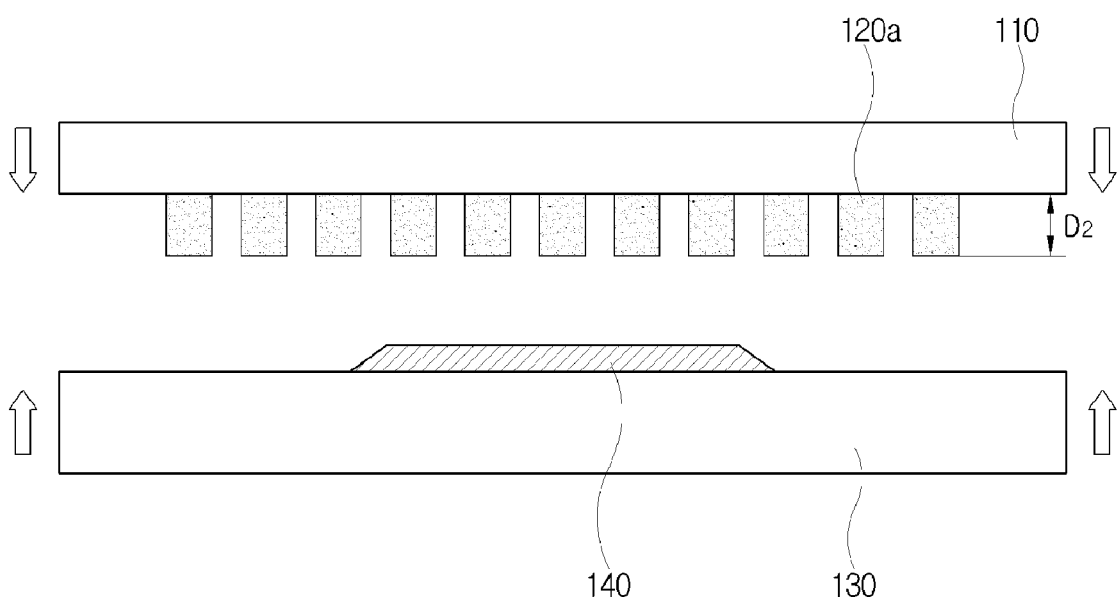

After forming the substantially uniform organic layers 120a on the cover substrate 110, as shown in FIG. 2B, the cover substrate 110 and the insulating substrate 130 are arranged facing each other with the organic layers 120a between them. Alignment keys (not shown) may be provided on the cover substrate 110 and the insulating substrate 130 for aligning the two substrates 110 and 130. The arrangement and alignment of the two substrates 110 and 130 may be performed in a vacuum chamber. The vacuum chamber minimizes permeation of air between two substrates 110 and 130 and decreases residual air or voids in the organic layer 120.

Figure 2C:
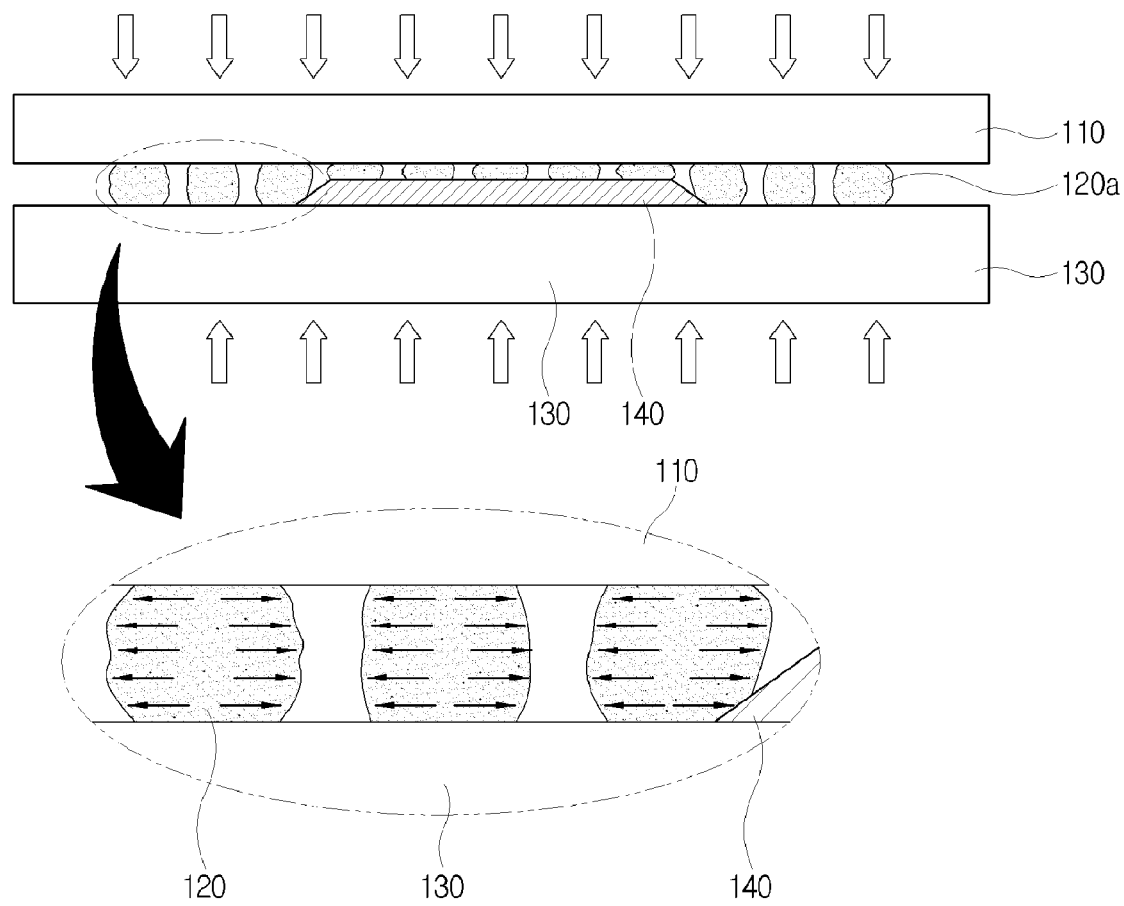

Then, as illustrated in FIG. 2C, a predetermined pressure is applied to the two substrates 110 and 130. The pressure is calculated considering the density, area, thickness D2, and interval r1 of the organic layers 120a. Applying pressure spreads the organic layers 120a in a direction parallel to the substrates 110 and 130, and accordingly the distance D1 between two substrates 110 and 130 becomes smaller than the thickness D2 of the organic layers 120a.

Figure 2D:
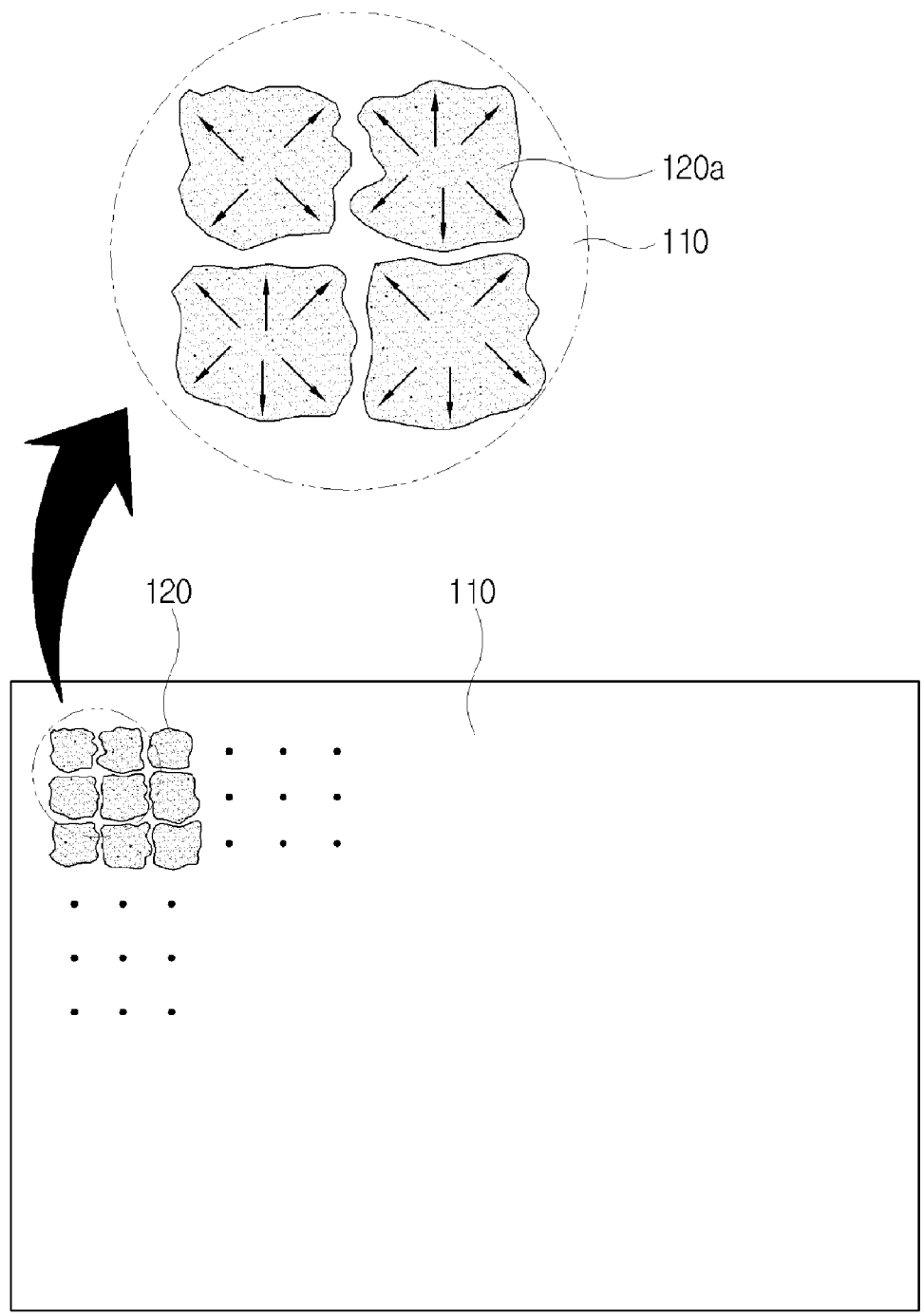

As illustrated in FIG. 2D, the pressure spreads the organic layers 120a in a radial direction parallel to the substrate 110 and gradually fills up the open space between the organic layers 120a. Here, the pressure is applied until there is no open space between the organic layers 120a.

Figure 2E:
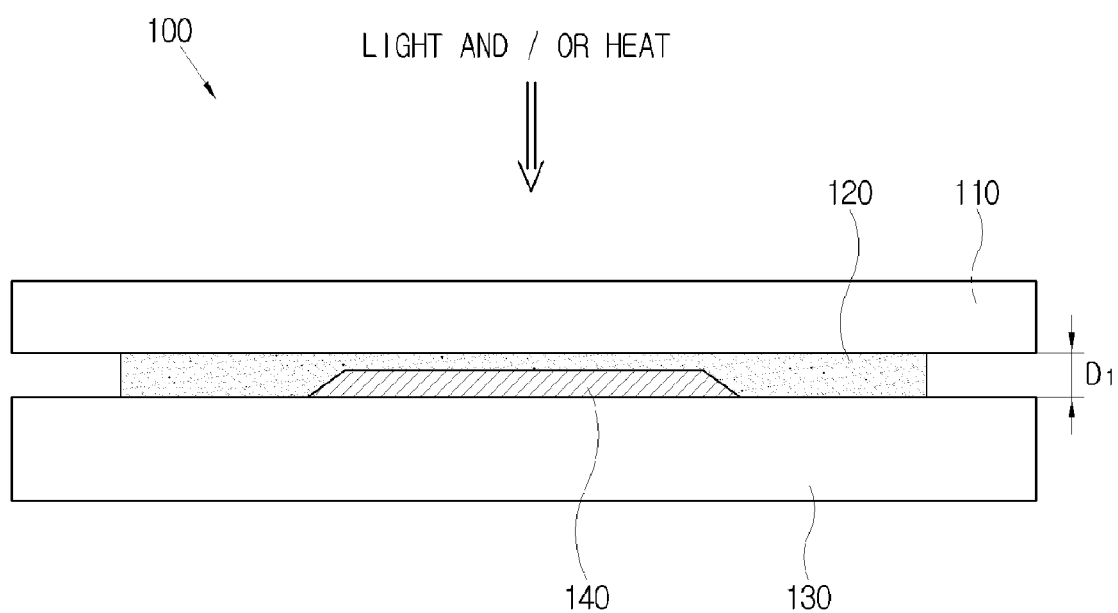

As illustrated in FIG. 2E, after filling up the open space between the organic layers 120a, the organic layer 120 is cured by applying heat and/or light. Through curing of the organic layer 120, the two substrates 110 and 130 are coupled to each other. According to the exemplary embodiment, the coupling of the two substrates 130 and 110 and the curing of the organic layer 120 are performed in a vacuum chamber. For a different exemplary embodiment, the curing of the organic layer 120 may be performed outside of a vacuum chamber.

As mentioned above, the organic layers 120a are formed to spread and fill up the space between the organic layers 120a to effectively coat the organic layer 120 on the whole front surface and minimize the distance D1 between the two substrates 110 and 130. Accordingly, the amount of oxygen and moisture that can permeate through the two substrates 110 and 130 may be minimized. It may also reduce a manufacturing cost by reducing the necessary amount of the organic layer 120.

Hereinafter, a display device according to a second exemplary embodiment of the present invention is explained referring to FIG. 3. Only different parts from the first exemplary embodiment are selected and explained, and the same components are denoted with the same reference numerals of the first exemplary embodiment.

Figure 3:
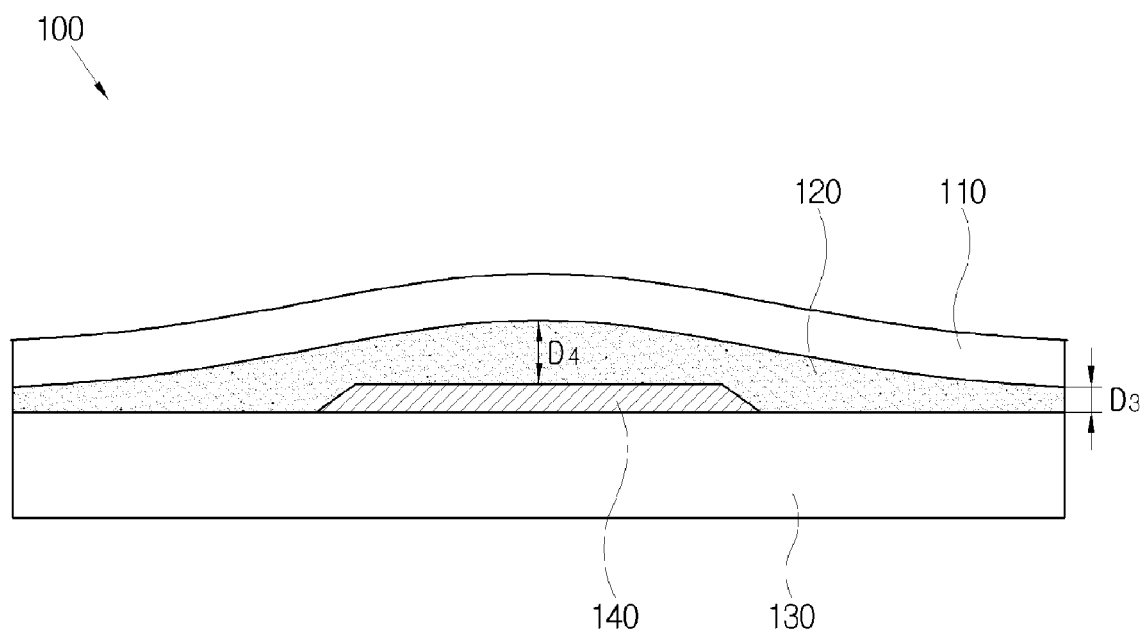
FIG. 3 is a cross sectional view of a display device according to a second exemplary embodiment of the present invention.

FIG. 3 is a cross sectional view of a display device according to the second exemplary embodiment of the present invention. A cover substrate 110, an insulating substrate 130, and the display device element 140 are identical to those of the display device according to the first exemplary embodiment.

The thickness of an organic layer 120 on the center of the insulating substrate 130 is different from that on the periphery of the insulating substrate 130. Specifically, the organic layer 120 on the periphery of the insulating substrate 130 is formed with a thickness D3, which is less than a thickness D4 of the organic layer 120 formed at the center of the insulating substrate 130. Here, the thickness D3 of the organic layer 120 on the periphery of the insulating substrate 130 may be between 1 µm and 20 µm.

Hereinafter, the second exemplary embodiment of the present invention is explained referring to FIG. 4. In the second exemplary embodiment, a characteristic part different from the first exemplary embodiment is selectively explained, and the omitted explanation may follow the first exemplary embodiment. The same components are denoted with the same reference numerals of the first exemplary embodiment.

Figure 4:
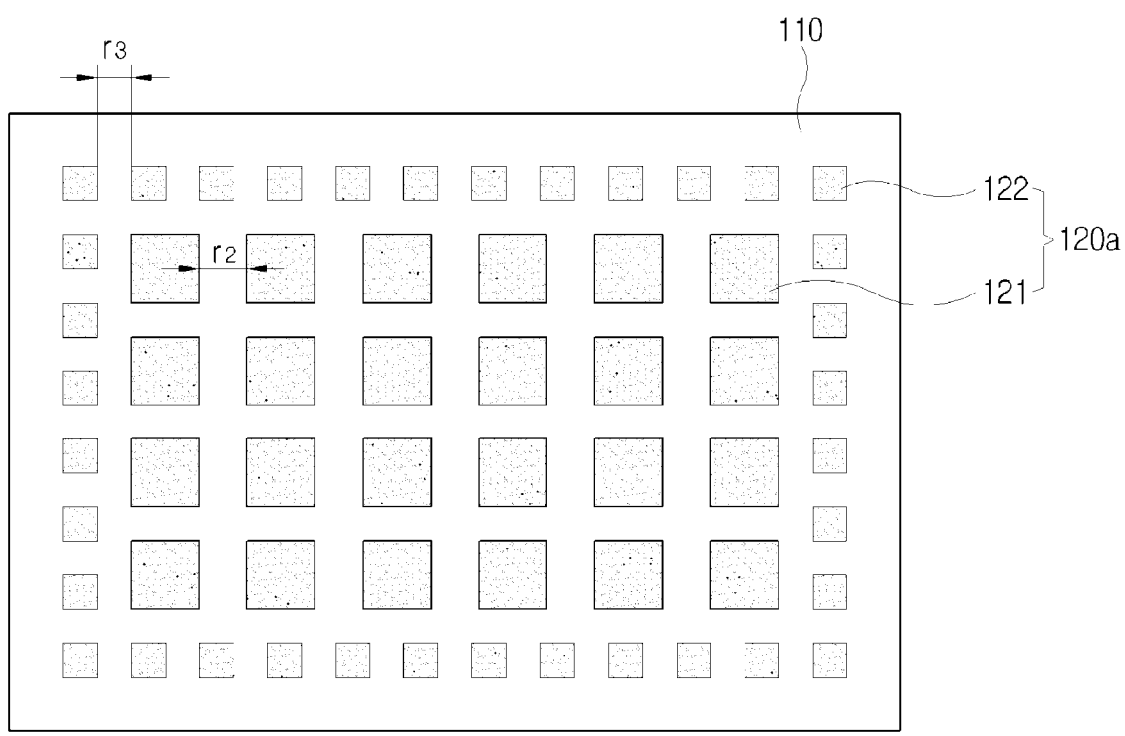
FIG. 4 explains a manufacturing method for a display device according to the second exemplary embodiment of the present invention.

FIG. 4 is a figure explaining the manufacturing method for the display device according to the second exemplary embodiment of the present invention. As illustrated in FIG. 4, a pattern form of the organic layers 120a according to the second exemplary embodiment is different from that of the first exemplary embodiment. The organic layers 120a according to the second exemplary embodiment include first organic layers 121 on a central portion of the cover substrate 110 and second organic layers 122 on the cover substrate 110 and substantially surrounding the first organic layers 121. The first organic layers 121 have a larger area than the second organic layers 122, and an interval r2 between first organic layers 121 is greater than an interval r3 between second organic layers 122. The intervals r2 and r3 are made different due to the different spreading degrees of the first and second organic layers 121 and 122. If the first and second organic layers 121 and 122 are formed by screen printing, the first organic layers 121 are formed thicker than the second organic layers 122. Thus, for the same pressure applied to the two substrates 110 and 130, the first organic layers 121 spread more readily than the second organic layers 122. Although the first organic layers 121 spread wider than the second organic layers 122 when pressing the substrates 110 and 130 together, the first organic layers 121 are thicker than the second organic layers 122 and make an OLED 100 (see FIG. 3) with a structure of a thickness D3 (see FIG. 3) around the periphery of the assembled two substrates 110 and 130 that is less than a thickness D4 (see FIG. 3) at the center of the two substrates 110 and 130.

Figure 5A:
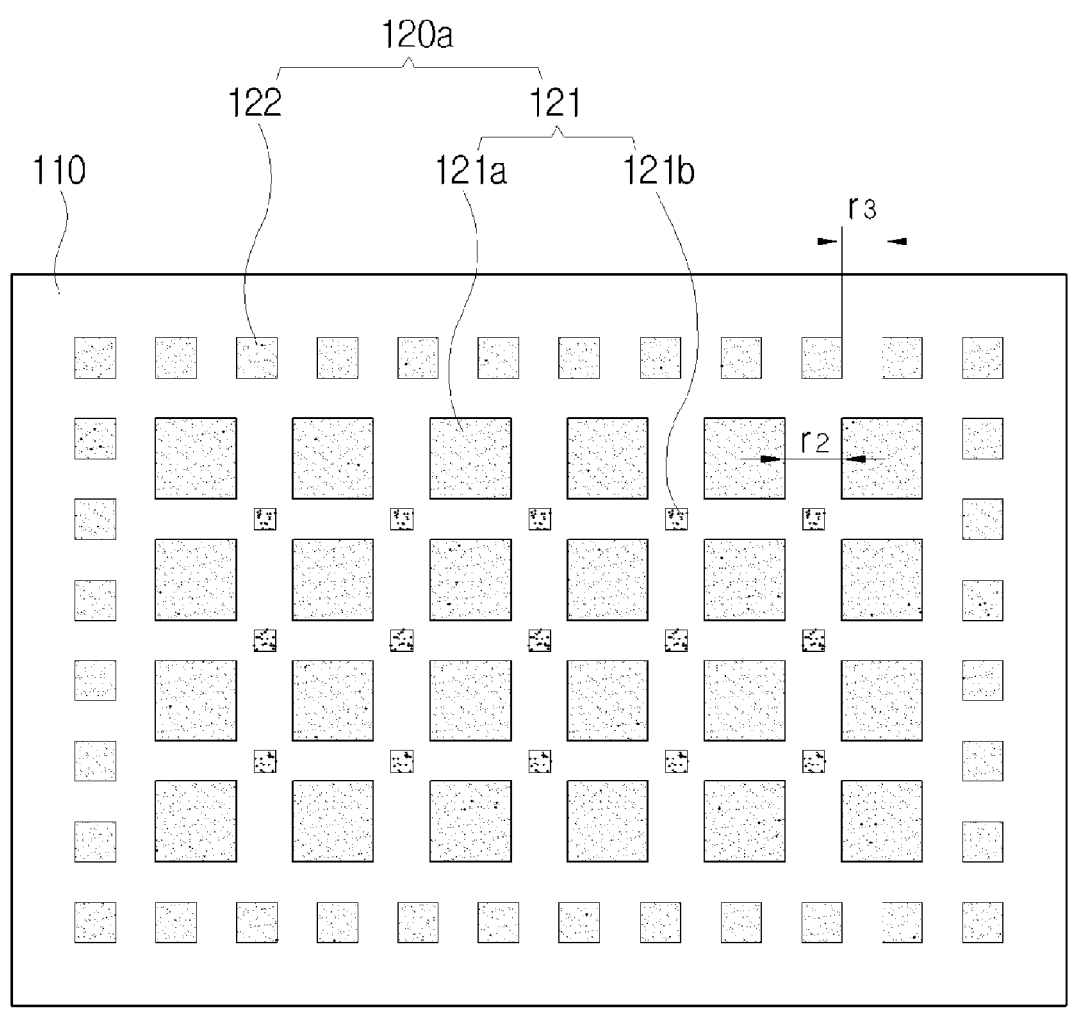
FIG. 5A, FIG. 5B, FIG. 6, and FIG. 7 explain manufacturing methods for manufacturing display devices according to third, fourth, and fifth exemplary embodiments of the present invention.
Figure 5B:
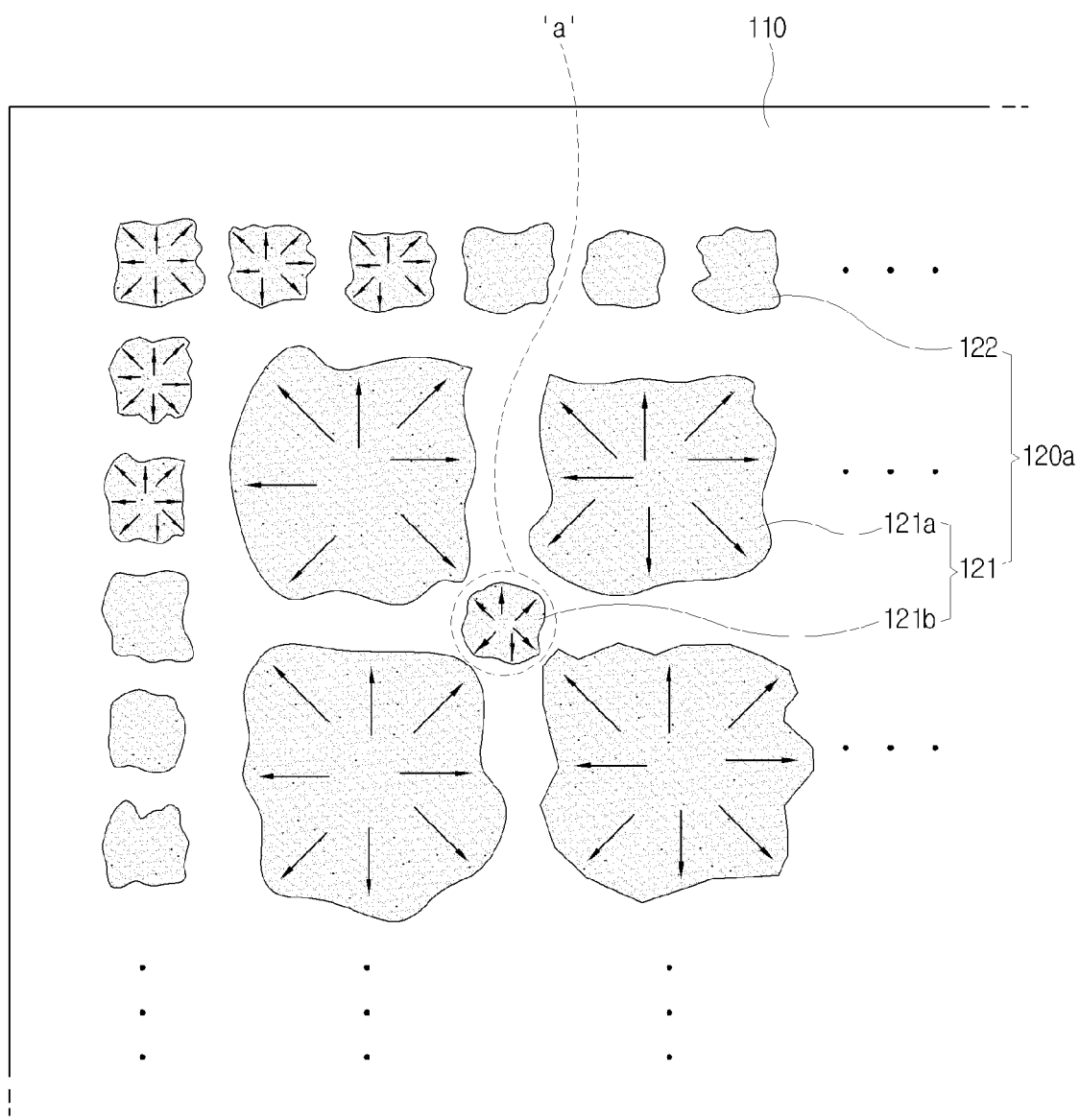

FIG. 5A and FIG. 5B are figures explaining manufacturing methods for manufacturing display devices according to a third exemplary embodiment of the present invention.

As illustrated in FIG. 5A, in the third exemplary embodiment a pattern of the organic layers 120a are different from those of the first and the second exemplary embodiments. The first organic layers 121 includes first sub organic layers 121a and second sub organic layers 121b disposed between the first sub organic layers 121a. More specifically, the second sub organic layers 121b have a smaller area than the first sub organic layers 121a and are substantially surrounded by four adjacent first sub organic layers 121a. That is, the second sub organic layers 121b are each positioned at a center of four neighboring first sub organic layers 121a. The reason for providing the second sub organic layers 121b is as follows. As illustrated in FIG. 5B, the first sub organic layers 121a spreading in a rectangular shape during an assembling process may leave an open space between the first sub organic layers 121a because of the distance from each first sub organic layer 121a to a center region 'a' of four neighboring first sub organic layers 121a. This defect may reduce the reliability of the product. To solve this problem, a smaller second sub organic layer 121b is formed at the center region 'a' of the neighboring four first sub organic layers 121a, and the first organic layers 121 may be formed without any open space.

Figure 6:
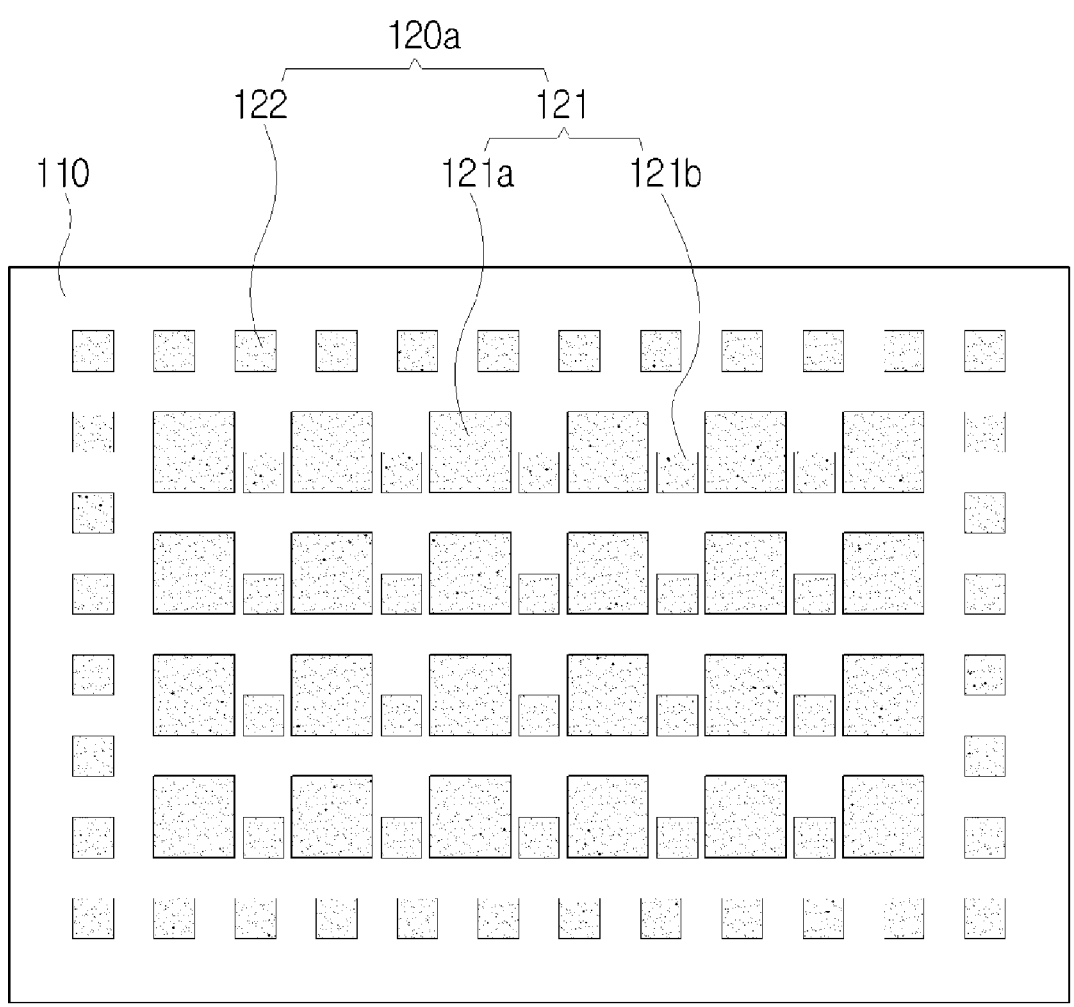
Figure 7:
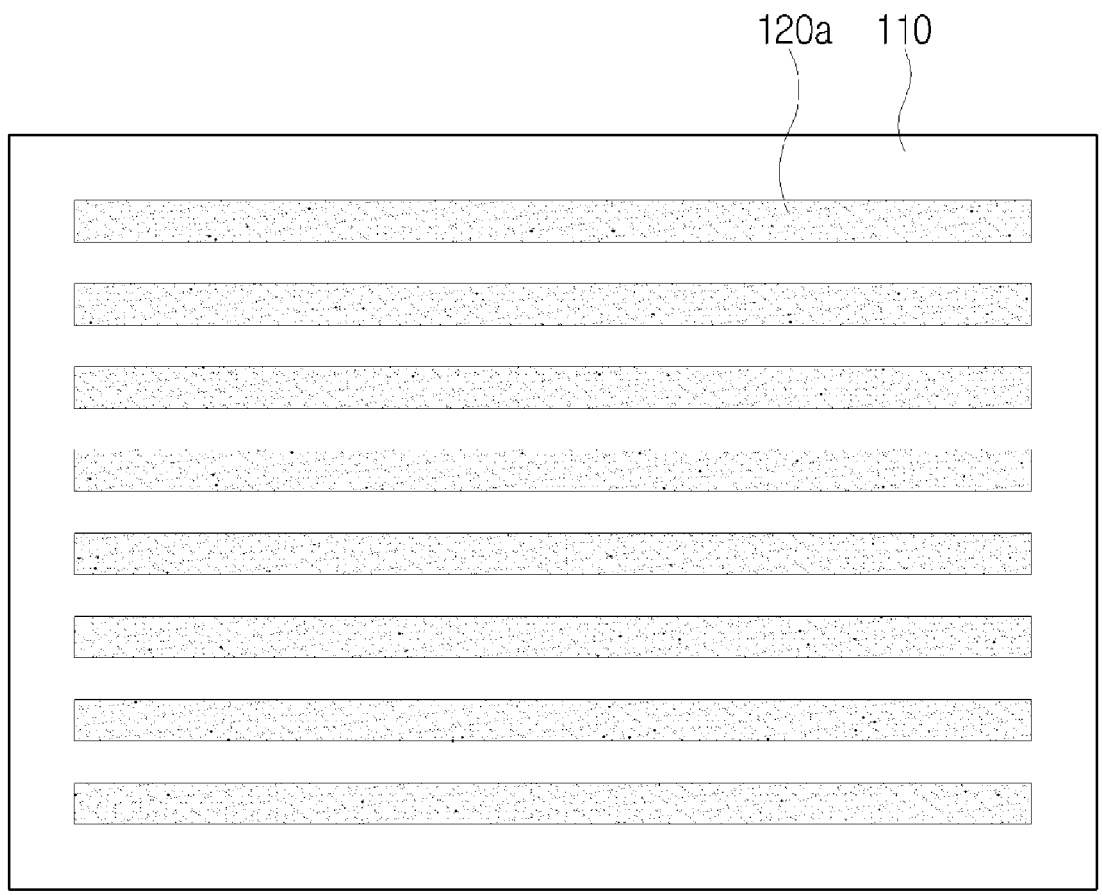

FIG. 6 and FIG. 7 are figures explaining manufacturing methods for manufacturing display devices according to fourth and fifth exemplary embodiments of the present invention.

The fourth exemplary embodiment is, as illustrated in FIG. 6, obtained by changing a position of the second sub organic layers 121b in the third exemplary embodiment. More specifically, the second sub organic layers 121b are disposed between horizontally adjacent first sub organic layers 121a. On the other hand, the second sub organic layers 121b may be disposed between vertically adjacent first sub organic layers 121a.

In a fifth exemplary embodiment as illustrated in FIG. 7, a plurality of organic layers 120a (continuously) extend in one direction and are spaced apart a predetermined interval from one another. The organic layers 120a are arranged parallel to each other.

Hereinafter, a manufacturing apparatus used for the present manufacturing method of the present invention is explained. More specifically, a screen printing apparatus is explained.

Figure 8:
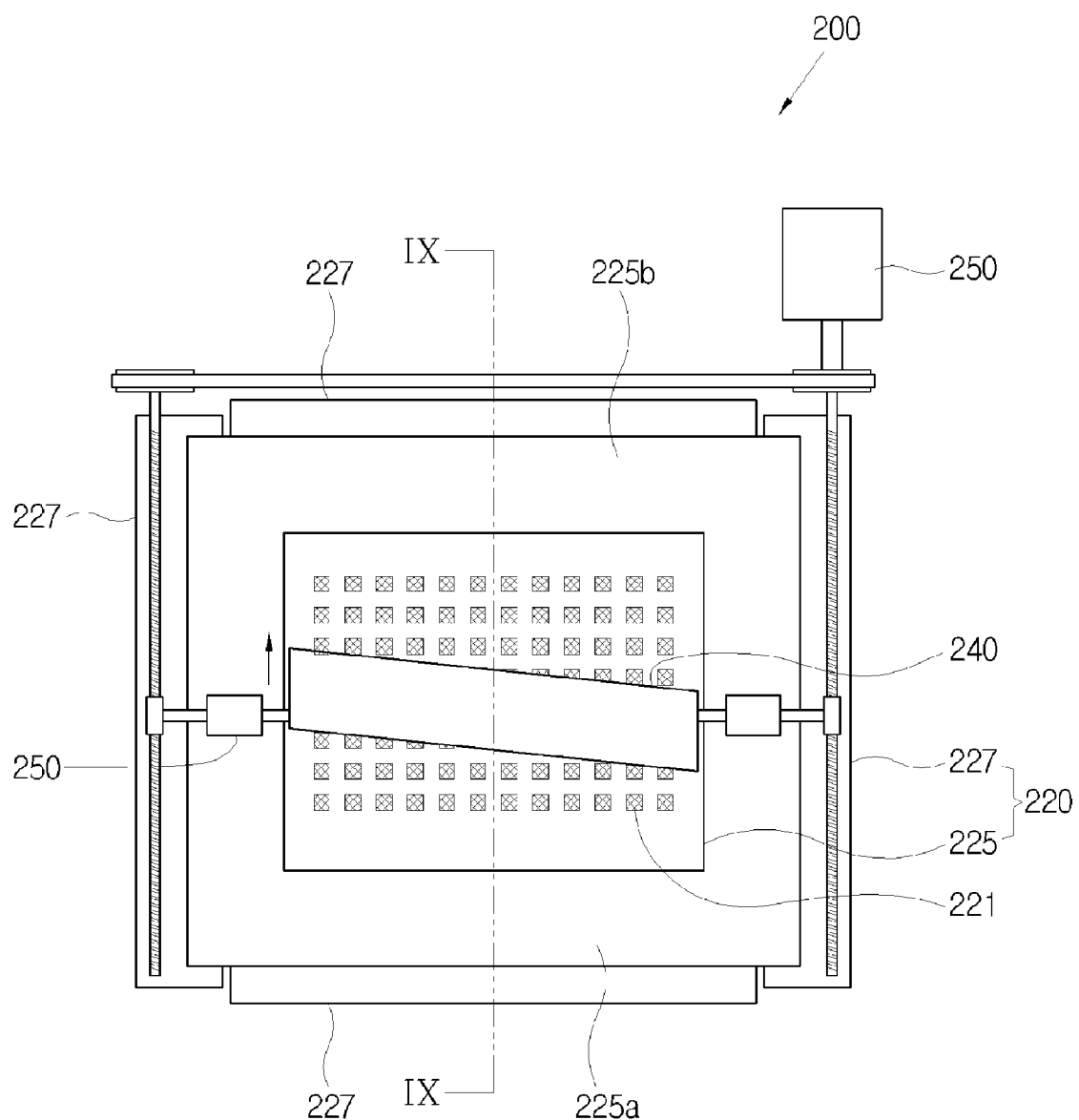
FIG. 8 explains a manufacturing apparatus for the display device manufactured with the manufacturing method according to the present invention.
Figure 9:
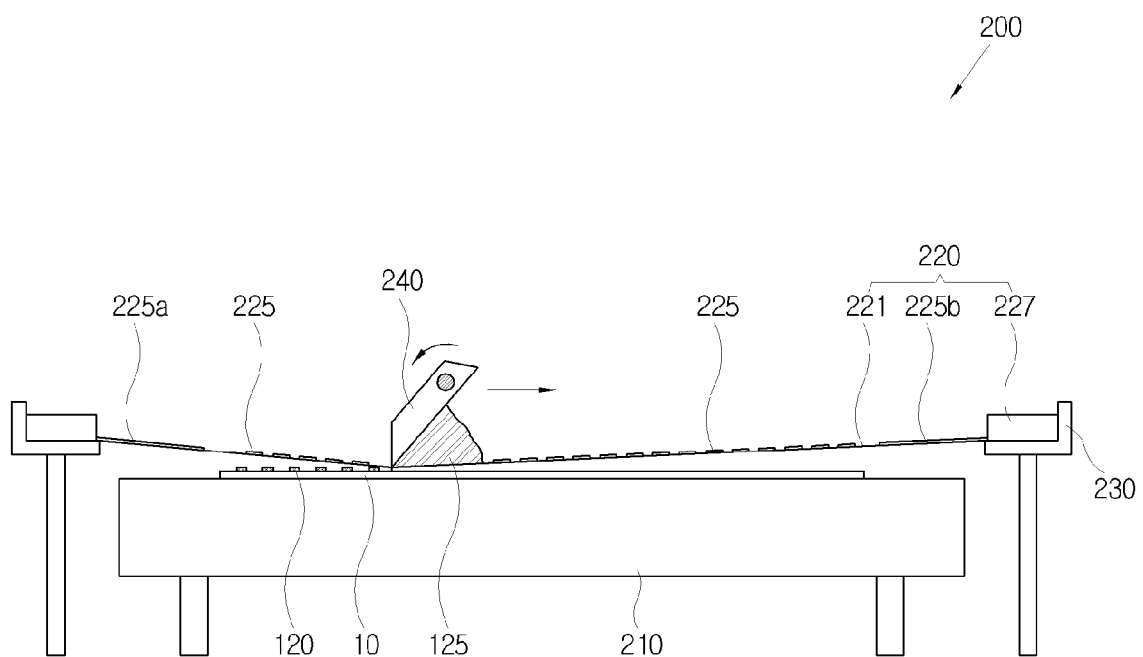
FIG. 9 is a cross sectional view cut along line IX-IX of FIG. 8.

FIG. 8 is a figure explaining a manufacturing apparatus for the display device manufactured with the manufacturing method according to the present invention, FIG. 9 is a cross sectional view cut along line IX-IX of FIG. 8, and FIG. 10A, FIG. 10B, FIG. 10C, FIG. 10D, and FIG. 10E show various shapes of masks used in the manufacturing apparatus for the display device.

A screen printing apparatus 200 according to an exemplary embodiment of the present invention includes a table 210 mounted with a substrate 10, a mask 220 disposed on the table 210, a mask holder 230 supporting at least one edge of the mask 220 and separating the mask 220 from the table 210, a squeeze 240 scanning on the mask 220, and a squeeze driving unit 250 to drive the squeeze 240.

The substrate 10 is arranged on the table 210. Here, the substrate 10 may include the cover substrate 110 (see FIG. 1) or the insulating substrate 130 (see FIG. 1).

The mask 220 is disposed on the table 210. The mask 220 includes mesh parts 221 corresponding to the substrate 10, a blocking part 225 surrounding the mesh parts 221, and a mask frame 227 provided at least one edge of the blocking part 225 and used in holding the mask 220.

Figure 10A:
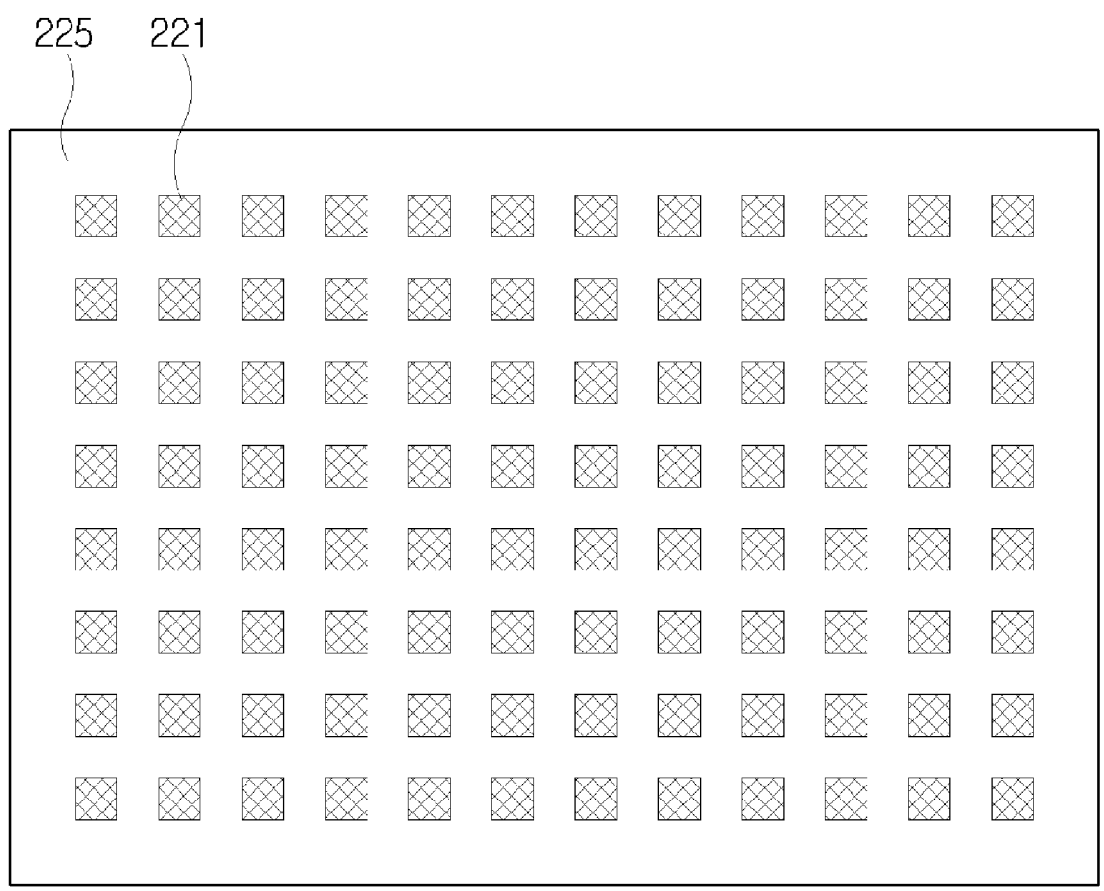
FIG. 10A, FIG. 10B, FIG. 10C, FIG. 10D, and FIG. 10E show various shapes of masks used in the manufacturing apparatus for the display device.

The mesh parts 221 are spaced apart from one another. The mesh parts 221 of approximately rectangular shapes as illustrated in FIG. 10A have substantially identical areas and are formed substantially uniformly on the front surface of the mask 220. The mask 220 of FIG. 10A is for forming a pattern of the organic layers 120 (see FIG. 2A) according to the first exemplary embodiment.

Figure 10B:
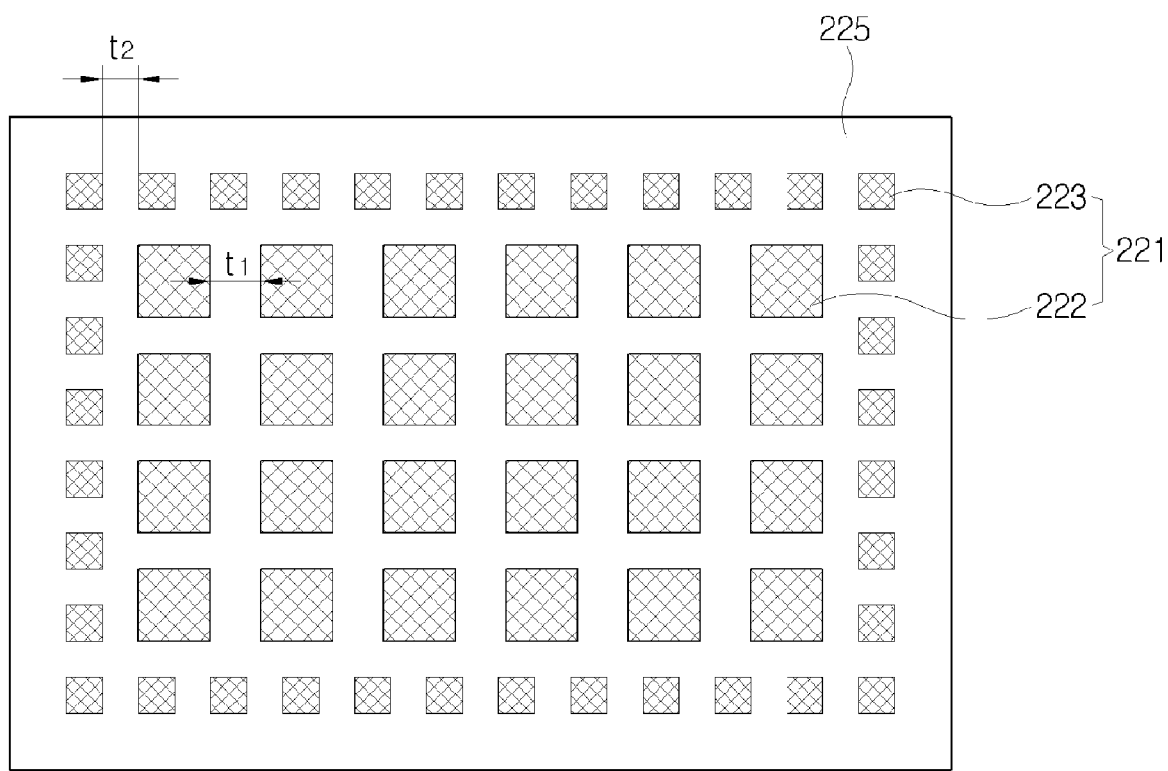

On the other hand, the mesh parts 221 as illustrated in FIG. 10B include first mesh parts 222 at a central portion of the mask 220 and second mesh parts 223 formed along the periphery of the first mesh parts 222. The first mesh parts 222 have a larger area than the second mesh parts 223. An interval t1 between first mesh parts 222 is greater than an interval t2 between second mesh parts 223. The mask 220 of FIG. 10B is for forming a pattern of the organic layers 120a (see FIG. 4) according to the second exemplary embodiment.

Figure 10C:
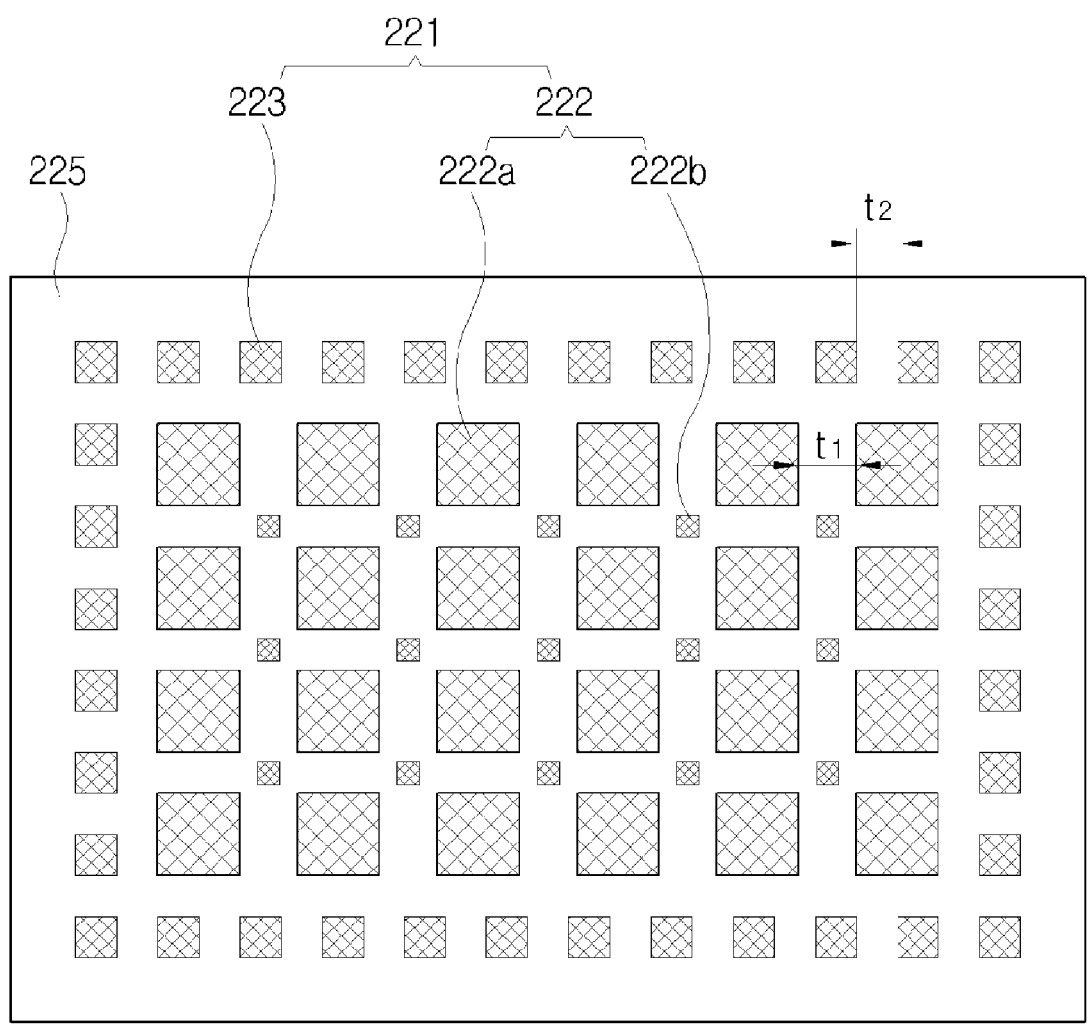

For another exemplary embodiment, as illustrated in FIG. 10C, the mesh parts 221 include first mesh parts 222 at a central portion of the mask 220 and second mesh parts 223 formed along the periphery of the first mesh parts 222. The first mesh parts 222 include first sub mesh parts 222a and second sub mesh parts 222b, which have a smaller area than the first sub mesh parts 222a and are interposed between the first sub mesh parts 222a. The first sub mesh parts 222 have a larger area than the second mesh parts 223, and the second sub mesh parts 222b have a smaller area than the second mesh parts 223. More specifically, the second sub mesh parts 222b are substantially surrounded by four adjacent first sub mesh parts 222a. Namely, the second sub mesh parts 222b are interposed at the center of four adjacent first sub mesh parts 222a. The mask 220 of FIG. 10C is for forming a pattern of the organic layers 120a (see FIG. 5A) according to the third exemplary embodiment.

Figure 10D:
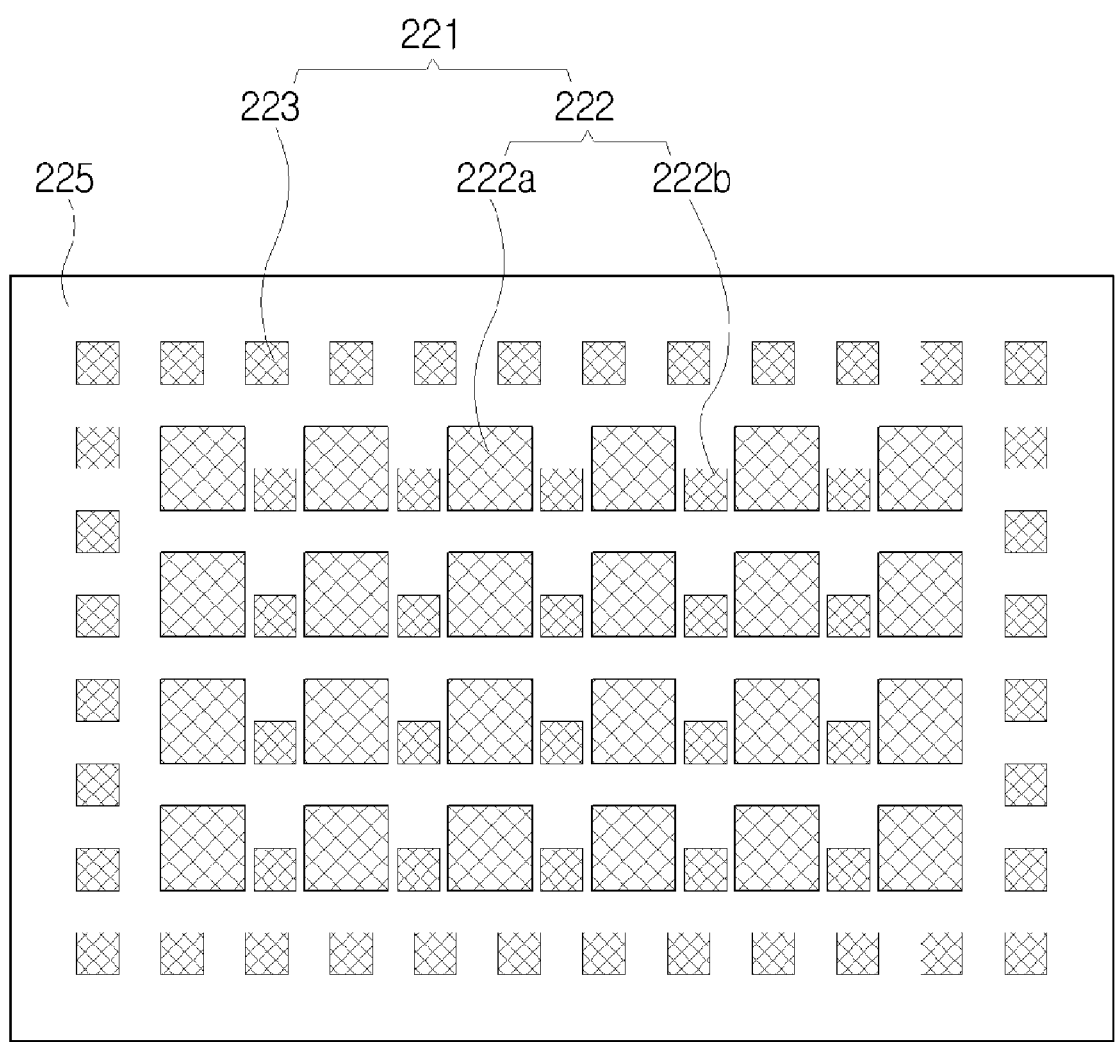

For another exemplary embodiment, as illustrated in FIG. 10D, second sub mesh parts 222b are provided between horizontally adjacent first sub mesh parts 222a. In FIG. 10D, the second mesh parts 222b of FIG. 10C are in a different position. Though not illustrated, the second sub mesh parts 222b may be provided between vertically adjacent first sub mesh parts 222a. The mask 220 of FIG. 10D is for forming a pattern of the organic layers 120a (see FIG. 6) according to the fourth exemplary embodiment.

Figure 10E:
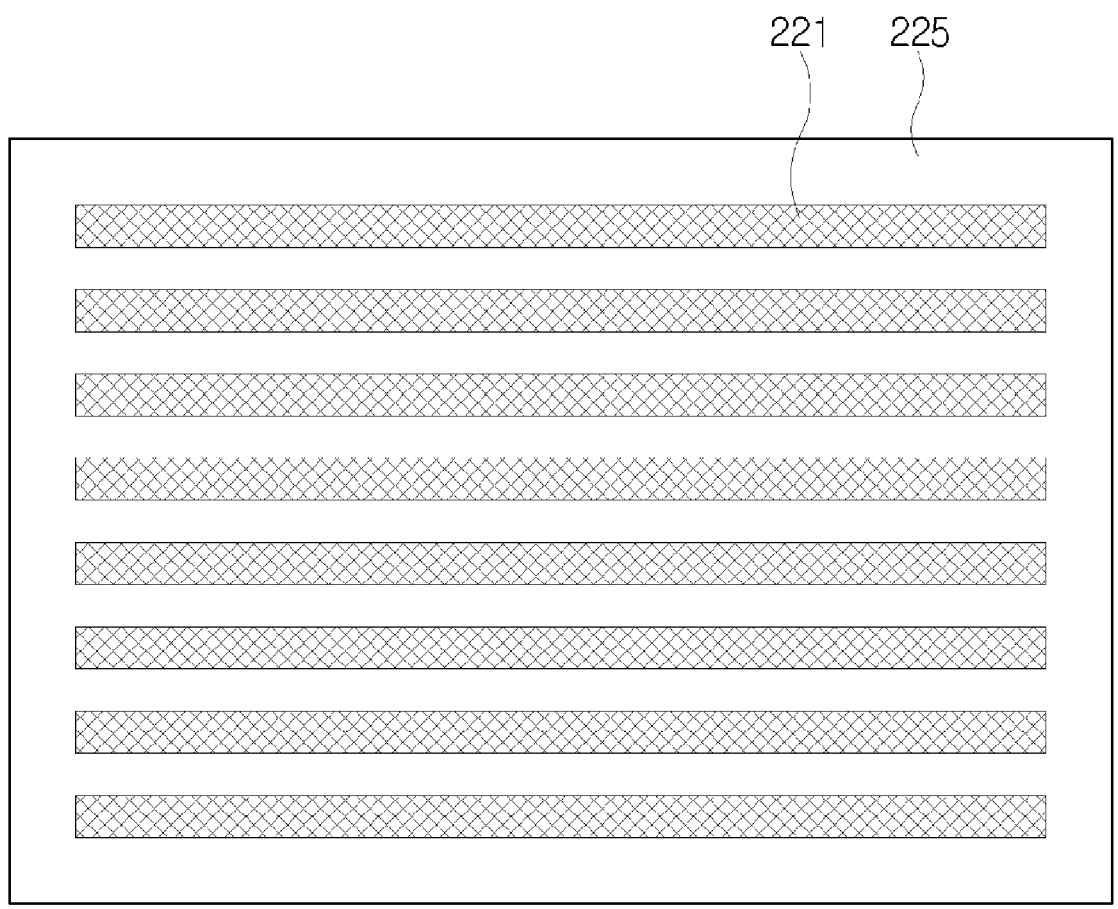

For another exemplary embodiment, plural mesh parts 221 are spaced apart a predetermined distance and extend parallel to one another. The mask 220 of FIG. 10E is for forming a pattern of the organic layers 120a (see FIG. 7) according to the fifth exemplary embodiment.

The mesh parts 221 may be provided in various shapes other than a rectangle such as circles, ovals, and polygons including diamonds.

The blocking part 225 may be made of flexible materials including plastics and is attached at a periphery part of the mesh parts 221 to keep the mesh parts 221 from sagging. The blocking part 225 moves up and down with the mesh parts 221 by pressure of the squeeze 240. The mask frame 227 mounted on the mask holder 230 supports and keeps the mask 220 from shaking during an operation of the squeeze 240.

The mask holders 230 are provided at both ends of the screen printing apparatus. The mask holder 230 keeps the mask 220 from moving during the operation of the squeeze 240 and keeps the mask 220a predetermined distance apart from the substrate 10.

The squeeze 240 scans the mask 220 and forms the organic layers 120a by filling the mesh parts 221 with an organic material. In detail, the squeeze 240 moves in a rectilinear path on the mask 220 from a first blocking part 225a at one edge of the mask 220 to a second blocking part 225b at the other edge of the mask 220 and fills up the mesh parts 221 with an organic material 125 accumulated on the first blocking part 225a at the edge. At the same time, the squeeze 240 pressures the mesh parts 221 toward the substrate 10 and accordingly forms the organic layers 120a of a predetermined thickness.

The squeeze driving unit 250 drives the squeeze 240 to move in horizontal and vertical directions.

As apparent from the above description, the present invention provides the manufacturing method for the display device that may minimize a permeation of oxygen and moisture.

The present invention also provides the manufacturing apparatus for manufacturing the display device that may minimize the permeation of oxygen and moisture.

Further, the present invention provides the display device that may minimize the permeation of oxygen and moisture.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A manufacturing method for manufacturing a display device, comprising:

forming a discontinuous organic layer on at least one of a cover substrate and an insulating substrate, the insulating substrate comprising a display device element and an organic light emitting layer;

arranging the insulating substrate and the cover substrate to face each other with the discontinuous organic layer interposed therebetween; and pressing the cover substrate and the insulating substrate together, wherein the discontinuous organic layer comprises first organic layers at a central portion of the at least one of the cover substrate and the insulating substrate and second organic layers substantially surrounding the first organic layers, an interval between the first organic layers is greater than an interval between each of the second organic layers, and in the arranging the insulating substrate and the cover substrate, the first organic layers and the second organic layers overlap the organic light emitting layer.

2. The manufacturing method of claim 1, wherein the discontinuous organic layer comprises a sealant.

3. The manufacturing method of claim 2, wherein the discontinuous organic layer comprises a plurality of organic layers, wherein the organic layers are separated from each other and are arranged in parallel.

4. The manufacturing method of claim 2, wherein pressing the cover substrate and the insulating substrate together fills up a space between the discontinuous organic layer.

5. The manufacturing method of claim 4, wherein the discontinuous organic layer comprises a plurality of organic layers, wherein the organic layers have substantially the same area.

6. The manufacturing method of claim 4, wherein at least some of the first organic layers are larger than the second organic layers.

7. A manufacturing method for manufacturing a display device, comprising:

forming a discontinuous organic layer on at least one of a cover substrate and an insulating substrate, the insulating substrate comprising a display device element and an organic light emitting layer;

arranging the insulating substrate and the cover substrate to face each other with the discontinuous organic layer interposed therebetween; and pressing the cover substrate and the insulating substrate together, wherein the discontinuous organic layer comprises first organic layers at a central portion of the at least one of the cover substrate and the insulating substrate and second organic layers substantially surrounding the first organic layers, and in the arranging the insulating substrate and the cover substrate, the first organic layers and the second organic layers overlap the organic light emitting layer, wherein the first organic layers comprise first sub organic layers and second sub organic layers interposed between the first sub organic layers, and the second sub organic layers are smaller than the first sub organic layers.

8. The manufacturing method of claim 5, wherein the organic layers are formed by at least one of screen printing, roll printing, and slit coating.

9. The manufacturing method of claim 8, wherein the organic layers have an area larger than or equal to 1 $\mu m^2$.

10. The manufacturing method of claim 8, wherein the organic layers have a thickness between 3 $\mu m$ and 20 $\mu m$.

11. The manufacturing method of claim 8, wherein the manufacturing method further comprises curing the organic layers.

12. The manufacturing method of claim 11, wherein pressing the cover substrate and the insulating substrate together is performed in a vacuum chamber.

13. The manufacturing method of claim 12, wherein curing the organic layers is performed in a vacuum chamber.

* * * * *